(12) United States Patent
Samoilov et al.

(10) Patent No.: US 9,230,903 B2
(45) Date of Patent: Jan. 5, 2016

(54) MULTI-DIE, HIGH CURRENT WAFER LEVEL PACKAGE

(71) Applicant: Maxim Integrated Products, Inc., San Jose, CA (US)

(72) Inventors: Arkadii V. Samoilov, Saratoga, CA (US); Peter R. Harper, Gilroy, CA (US); Viren Khandekar, Flower Mound, TX (US); Pirooz Parvarandeh, Los Altos Hills, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/803,612

(22) Filed: Jul. 20, 2015

(65) Prior Publication Data

US 2015/0325512 A1 Nov. 12, 2015

Related U.S. Application Data

(62) Division of application No. 13/732,664, filed on Jan. 2, 2013, now Pat. No. 9,087,779.

(51) Int. Cl.
*H01L 23/498* (2006.01)
*H01L 23/00* (2006.01)
*H01L 21/56* (2006.01)
*H01L 21/48* (2006.01)
*H01L 21/311* (2006.01)

(52) U.S. Cl.
CPC ........ *H01L 23/49838* (2013.01); *H01L 21/311* (2013.01); *H01L 21/4853* (2013.01); *H01L 21/4857* (2013.01); *H01L 21/563* (2013.01); *H01L 24/81* (2013.01); *H01L 2924/14* (2013.01); *H01L 2924/1515* (2013.01)

(58) Field of Classification Search
CPC ................................. H01L 21/56; H01L 23/28
USPC ..................................... 438/124, 126; 257/773
See application file for complete search history.

(56) References Cited

U.S. PATENT DOCUMENTS

| 9,087,779 | B2 | 7/2015 | Samoilov et al. |
| 2006/0180936 | A1 | 8/2006 | Japp et al. |
| 2008/0265434 | A1 | 10/2008 | Kurita |
| 2010/0320599 | A1 | 12/2010 | Chan et al. |
| 2013/0068514 | A1* | 3/2013 | Hsu ........................ H01L 21/563 174/259 |

* cited by examiner

*Primary Examiner* — Walter H Swanson
(74) *Attorney, Agent, or Firm* — Advent LLP

(57) ABSTRACT

Wafer-level package semiconductor devices for high-current applications are described that have pillars for providing electrical interconnectivity. In an implementation, the wafer-level package devices include an integrated circuit chip having at least one pillar formed over the integrated circuit chip. The pillar is configured to provide electrical interconnectivity with the integrated circuit chip. The wafer-level package device also includes an encapsulation structure configured to support the pillar. The wafer-level package device also includes an integrated circuit chip device (e.g., small die) configured upon the integrated circuit chip (e.g., large die). In the wafer-level package device, the height of the integrated circuit chip device is less than the height of the pillar and/or less than the combined height of the pillar and the one or more solder contacts.

4 Claims, 11 Drawing Sheets

US 9,230,903 B2

MULTI-DIE, HIGH CURRENT WAFER LEVEL PACKAGE

CROSS-REFERENCE TO RELATED APPLICATIONS

The present application constitutes a divisional of U.S. patent application Ser. No. 13/732,664, entitled MULTI-DIE, HIGH CURRENT WAFER LEVEL PACKAGE, by Arkadii V. Samoilov et al., filed Jan. 2, 2013, which is currently co-pending or is an application of which a currently co-pending application is entitled to the benefit of the filing date. U.S. patent application Ser. No. 13/732,664 is incorporated herein by reference in its entirety to the extent such subject matter is not inconsistent herewith.

BACKGROUND

Flat no-lead packaging technologies, such as quad-flat no-leads (QFN) packaging technologies, physically and electrically connect integrated circuit chips to printed circuit boards. Flat no-lead packaging technologies typically employ a lead-frame that includes an integrated circuit chip (die) mounted thereon. The die may be electrically interconnected with the lead-frame through wire-bonding technology or flip-chip technology. An encapsulation structure is then formed over the lead-frame to encapsulate the integrated circuit chip.

SUMMARY

Techniques are described for fabricating wafer-level package semiconductor devices for high-current applications. In one or more implementations, the wafer-level package devices include an integrated circuit chip (e.g., die) having at least one pillar (e.g., a copper pillar) formed over the integrated circuit chip. The pillar is configured to provide electrical interconnectivity to the integrated circuit chip. An encapsulation structure configured to support the pillar is formed over the surface of the integrated circuit chip. In one or more implementations, an integrated circuit chip device (e.g., flip-chip die) may be mounted to the integrated circuit chip so that the integrated circuit chip device is in electrical communication with the integrated circuit chip. The integrated circuit chip device is at least partially encapsulated by the encapsulation structure. Further, one or more solder contacts are formed upon a top surface (e.g., exposed end) of the copper pillar for serving as a connection between the wafer-level package device and corresponding pads of a printed circuit board, for facilitating connection between the device and the printed circuit board. In the wafer-level package device, the height of the integrated circuit chip device is less than the height of the pillar and/or less than the combined height of the pillar and the one or more solder contacts.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Figure 1:
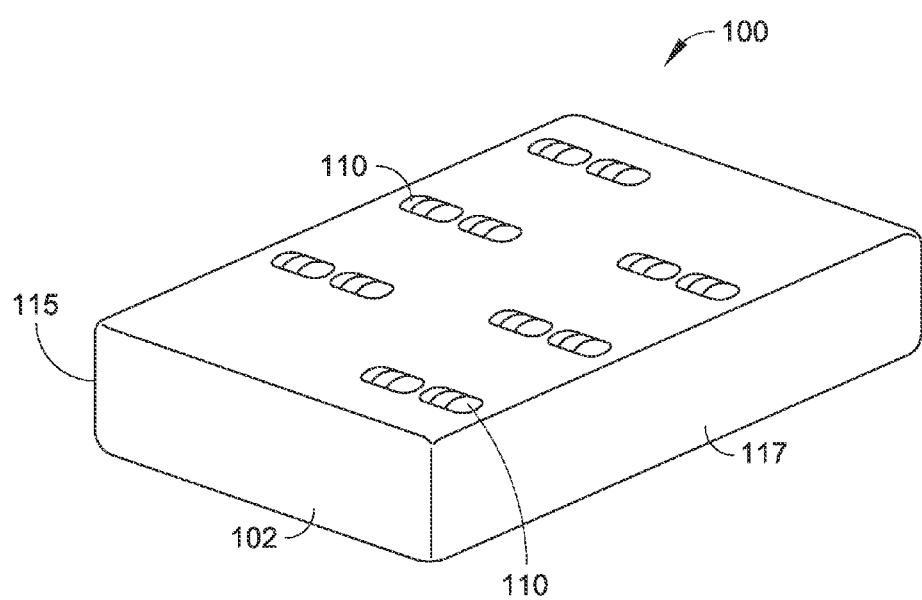
FIG. 1 is a diagrammatic perspective elevation view illustrating a wafer-level package device in accordance with an example implementation of the present disclosure.

Devices that employ flat no-lead packaging technologies, such as QFN packaging technologies, provide good mechanical protection to the integrated circuit chips (dies) contained within the device packages by fully encapsulating the integrated circuit chips within the package. However, flat no-lead (e.g., QFN) package devices are expensive to produce and typically provide relatively low pin counts (e.g., the pins of a QFN are typically located along the die edge).

Wafer-level packaging is a chip-scale packaging technology that encompasses a variety of techniques whereby integrated circuit chips are packaged at wafer level, prior to segmentation. Wafer-level packaging extends the wafer fabrication processes to include device interconnection and device protection processes. Consequently, wafer-level packaging streamlines the manufacturing process by allowing for the integration of wafer fabrication, packaging, testing, and burn-in processes at the wafer level. Compared to flat no-lead (QFN) packaging techniques, wafer-level packaging is generally less costly to implement since packaging occurs at wafer level, while flat no-lead packaging is performed at strip level. Moreover, the footprint of a comparable wafer-level packaged device is typically less than that of a QFN packaged device since wafer-level packages can be nearly equal to the size of the integrated circuit chip.

Accordingly, techniques are described that employ wafer-level packaging techniques to fabricate semiconductor devices that have form factors similar to those of devices that employ flat no-lead (QFN) packaging technologies. The wafer-level package devices may thus provide mechanical protection of the integrated circuit chips (dies) contained within the device packages that is similar to that provided by flat no-lead (QFN) devices, while maintaining the benefits inherent in wafer-level packaging (e.g., lower cost, smaller package size, high pin count, etc.). The wafer-level package devices include an integrated circuit chip (e.g., die) having pillars that provide electrical interconnectivity to the devices. In specific implementations, the pillars may be copper pillars having a solder layer formed over the exposed end of the pillar. An encapsulation structure configured to support the pillar is formed over the surface of the integrated circuit chip at wafer level. In embodiments, the encapsulation structure may be fabricated from epoxy, or a like substance. In one or more implementations, an integrated circuit chip device may be mounted to the integrated circuit chip so that the integrated circuit chip device is in electrical communication with the integrated circuit chip. The integrated circuit chip device is at least partially encapsulated by the encapsulation structure. Once singulated from the wafer, the devices may be mounted to a printed circuit board, and the pillars provide electrical interconnectivity through the backside of the device that interface with the pads of the printed circuit board.

Example Implementations

FIGS. 1 through 5 illustrate wafer-level package devices 100 in accordance with example implementations of the present disclosure. As shown, each device 100 includes an integrated circuit chip 102 comprised of a semiconductor substrate 104 (e.g., wafer) having one or more integrated circuits 106 formed therein. In embodiments, the semiconductor substrate 104 is formed of silicon. Further, the integrated circuit chip 102 includes all front-end-of-line (FEOL) and necessary interconnect circuitry. In various implementations, the integrated circuits 106 may comprise digital integrated circuits, analog integrated circuits, mixed signal integrated circuits, combinations thereof, and so forth. The integrated circuits 106 may be formed through suitable FEOL fabrication techniques.

Figure 2:
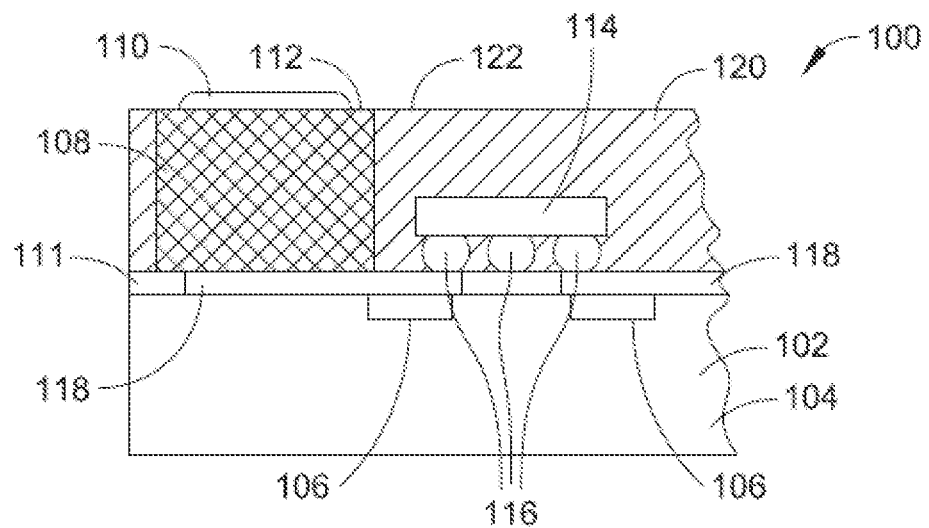
FIG. 2 is a diagrammatic partial-cross-sectional end view of a section of a wafer-level package device shown in accordance with an exemplary implementation of the present disclosure.
Figure 3:
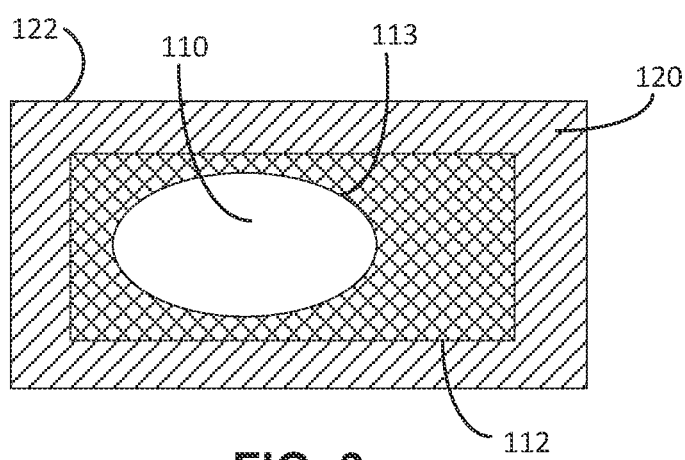
FIG. 3 is a top plan view of a portion of the wafer-level package device shown in FIG. 2.
Figure 4:
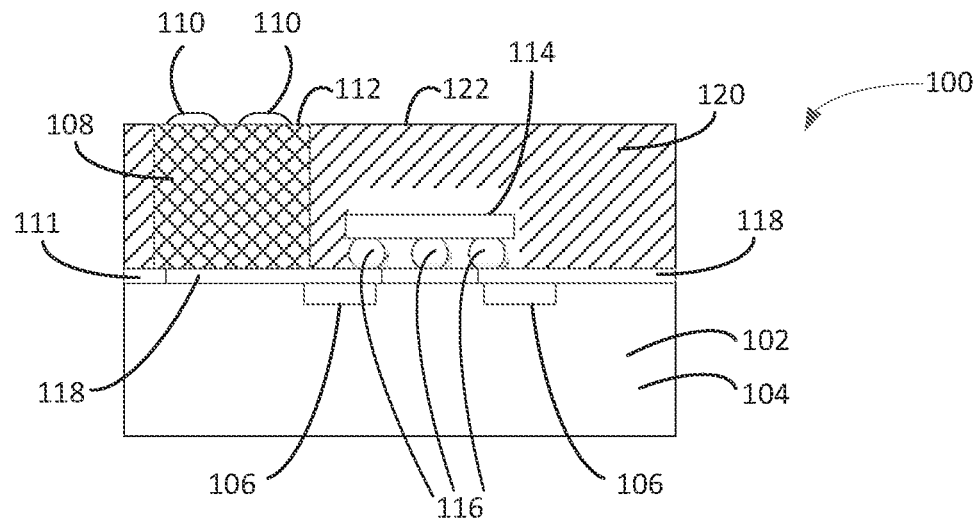
FIG. 4 is a diagrammatic partial-cross-sectional end view of a section of the wafer-level package device shown in FIG. 1.
Figure 5:
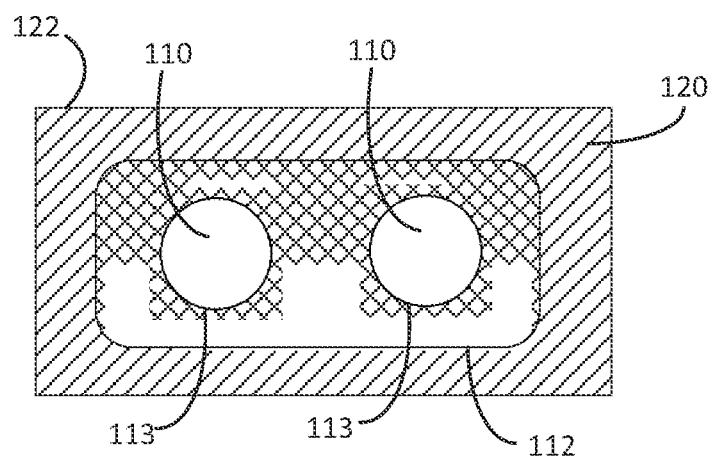
FIG. 5 is a top plan view of a portion of the wafer-level package device shown in FIG. 4.

The device 100 further includes pillars 108 extending from (e.g. formed upon) a surface 111 of the semiconductor substrate 104. In embodiments, the pillars 108 include multiple, stacked layers, such as a first (e.g., a bottom) pillar layer (P1) and a second (e.g., a top) pillar layer formed (e.g., stacked) upon the first pillar layer (P2) (as shown in FIG. 7). In an implementation, the pillars 108 are copper pillars. In other embodiments, the pillars 108 may be formed of other metals (e.g., gold or tin) or metal alloys. The pillars 108 may be fabricated via suitable manufacturing processes, such as the lamination/deposition process described herein. In embodiments, photo-imageable liquid dielectric materials for small copper thickness values (e.g., up to approximately 20 micrometers (20 um) or dry film for larger copper thickness values can be used to plate the copper. The pillars 108 may have an aspect ratio (ratio of the width of the pillar to the height of the pillar) ranging from one to one (1:1) to about twenty to one (20:1). The pillars 108 serve to provide electrical interconnections between the integrated circuit chip 102 and a printed circuit board 600 (shown in FIG. 6) that is configured to receive the device 100. In embodiments, such as shown in FIGS. 2 and 3, each pillar 108 can include a single solder contact 110 disposed upon an exposed end 112 (e.g., the end distal from the substrate 104) of the pillar 108. In embodiments, the single solder contact 110 can cover most of (e.g., almost all) of the exposed end 112 of the pillar 108. In alternative embodiments, such as shown in FIG. 3, a solder mask opening 113 can be defined upon the exposed end 112 of the pillar 108 using a photo-imageable dielectric material (e.g., Polyimide (PI), Polybenzoxazole (PBO), Benzocyclobuten (BCB)) to form a pad (e.g., solder pad) for the individual solder area, such that the single solder contact 110 may be disposed through the solder mask opening 113. In further embodiments, such as shown in FIGS. 4 and 5, each pillar 108 can include multiple solder contacts 110 disposed upon an exposed end 112 of the pillar 108. The multiple solder contacts 110 may be disposed through multiple solder mask openings 113 (e.g., which form multiple solder areas), as shown in FIG. 5. In embodiments, by restricting the solderable area on the pillar surface, one or more solder contacts (e.g., solder bumps) 110 can be formed on the pillar 108 which can have a substantially greater height compared to the solder contacts 110 shown in FIG. 2. This increased height can promote improved solder joint fatigue life. In an embodiment, the pads (e.g., solder pads, solder areas) formed by the solder mask openings 113 may be rectangular (for maximizing the use of the surface area of the pillars), with rounded corners (for minimizing stress). In embodiments, the solder contacts 110 serve as a connection between the device 100 (e.g., the pillars 108) and corresponding pads (e.g., formed by solder mask openings 606) disposed over the printed circuit board 600 (shown in FIG. 6). In implementations, the solder contacts 110 may be fabricated of a lead-free solder composition such as a Tin-Silver-Copper (Sn—Ag—Cu) alloy solder (i.e., SAC), a Tin-Silver (Sn—Ag) alloy solder, a Tin-Copper (Sn—Cu) allow solder, and so on. In embodiments, such as shown in FIGS. 2 and 3, the device 100 may be optimized for users wanting a QFN-style package or a land grid array (LGA)-style package. In other embodiments, such as shown in FIGS. 4 and 5, the device 100 may be optimized for users wanting a wafer-level packaging (WLP)-style package.

In some implementations, the device 100 may include an integrated circuit chip device 114 disposed over and connected to (e.g., mounted to) the surface 111 of the integrated circuit chip 102 (e.g., wafer). In embodiments, the integrated circuit chip device 114 may be in electrical communication with the integrated circuits 106 of the integrated circuit chip 102. For instance, as shown in FIGS. 2 and 4, integrated circuit chip device 114 includes solder bumps 116 that allow the device 114 to be in electrical contact with the device 100. The solder bumps 116 may, for example, be positioned over (e.g., connected to, disposed upon) a redistribution structure, such as a redistribution layer (RDL) 118, of the wafer-level chip-scale device 100 to allow electrical communication between the integrated circuit chip device 114 and device 100 (e.g., the integrated circuits 106, etc.). The RDL 118 may be formed from a conductive material, such as polysilicon, aluminum, copper, and so on. Thus, the integrated circuit chip device 114 extends additional functionality to device 100 by enabling system-in-a-package capabilities. In implementations, integrated circuit chip device 114 may be a digital integrated circuit device, an analog integrated circuit device, a mixed-signal integrated circuit device, and so forth. As with the solder contacts 110 described above, the solder bumps 116 may be fabricated of a lead-free solder composition such as a Tin-Silver-Copper (Sn—Ag—Cu) alloy solder (i.e., SAC), a Tin-Silver (Sn—Ag) alloy solder, a Tin-Copper (Sn—Cu) alloy solder, and so on. However, it is contemplated that Tin-Lead (PbSn) solder compositions may be used. In embodiments, an underfill (e.g., a capillary underfill) can be applied to integrated circuit chip device 114. In embodiments, in the integrated device 100, the pillar 108 extends a first distance from the integrated circuit chip 102 (e.g., the distal end 112 of the pillar 108 is located a first distance (e.g., first height) above the surface 111 of the integrated circuit chip 102), while the integrated circuit chip device 114 has an end distal to the surface 111, the distal end of the integrated circuit chip device 114 extending (e.g., being located) a second distance (e.g., second height) from (e.g., above) the surface 111 of the integrated circuit chip 102. Further, the solder contact(s) 110 are located at a third distance (e.g., third height) above the surface 111 of the integrated circuit chip 102. In embodiments, the second distance/height may be less than the first distance/height and/or less than the third distance/height (e.g., the height of the integrated circuit chip device 114 is less than the height of the pillar 108 and/or less than the combined height of the pillar 108 and solder contact(s) 110). Thus, the pillars 108 are of an appropriate height to accommodate the integrated circuit chip device (e.g., flip-chip (FC) die) 114 and to carry high currents.

The device 100 also includes an encapsulation structure 120 disposed over the surface 111 of the integrated circuit chip 102. As shown in FIGS. 2 and 4, the encapsulation structure 120 at least substantially encapsulates the pillars 108. Thus, the encapsulation structure 120 provides support and insulation to the pillars 108 (and the integrated circuit chip device 114 when the device 100 employs an integrated circuit chip device 114). The pillars 108 have a length that at least substantially extends to the depth of the encapsulation structure 120. As shown in FIGS. 2 and 4, the solder contacts 110 extend beyond a plane defined by the surface 122 of the encapsulation structure 120 to allow the solder contacts 110 to connect to the corresponding pads (e.g., formed by the solder mask openings 606) of the printed circuit board 600 (shown in FIG. 6). In an implementation, the encapsulation structure 120 may be a polymer material, such as epoxy, or the like, deposited over the surface 111 of the wafer-level chip-scale package device 100.

Figure 6:
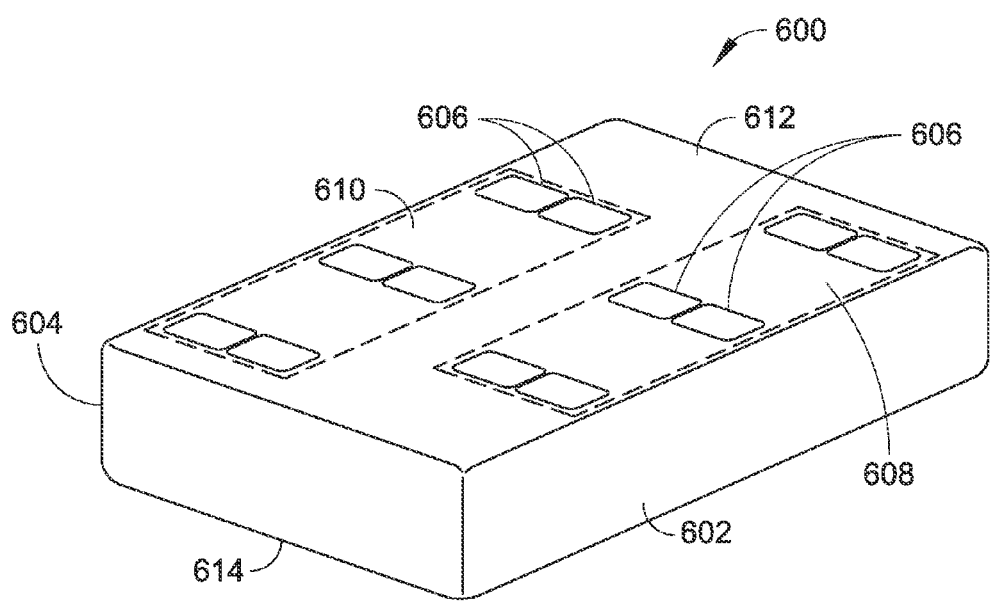
FIG. 6 is a diagrammatic perspective elevation view illustrating a printed circuit board configured for being connected to the wafer-level package device shown in FIG. 1.
Figure 7:
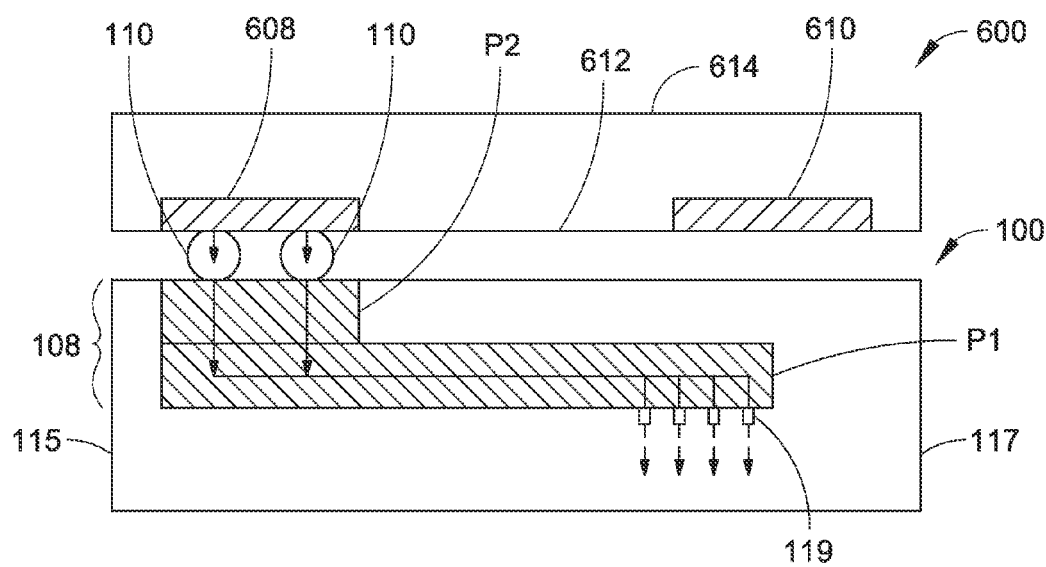
FIG. 7 is a longitudinal cross-sectional view depicting the printed circuit board shown in FIG. 6 being connected to the wafer-level package device shown in FIG. 1.

Referring to FIGS. 6 and 7, in embodiments, the device 100 may be configured for being connected to a printed circuit board 600. In embodiments, the printed circuit board 600 includes a first trace (e.g., a first copper trace) 608 and a second trace (e.g., a second copper trace) 610. Further, the printed circuit board 600 includes: a first surface 612, a second surface 614 being disposed opposite the first surface 612, a first side 602, the first side and a second side 604, the second side 604 disposed opposite the first side 602. FIG. 7 depicts device 100 being connected to printed circuit board 600 and further depicts the flow of electricity within device 100. For example, as shown in FIG. 7, electrical current is injected from the first copper trace 608 of the printed circuit board 600 into the solder contacts 110 of device 100. The electrical current is then directed into the device 100, via the solder contacts 110, and flows within the device 100 in a direction which is away from a first side 115 of the device 100 and towards a second side 117 of the device 100 and is routed within the device 100 through vias 119 formed within the device 100. In embodiments, the printed circuit board 600 may be aligned over the device 100 such that, the first copper trace 608 is oriented over pillars 108 which are proximal to the first side 115 of the device 100, while the second copper trace 610 is oriented over pillars 108 which are proximal to the second side 117 of the device 100. In embodiments, the size of the solder mask openings 113 of the device 100 and the size of the solder mask openings 606 of the printed circuit board 600 may be chosen such that a uniform solder height is provided across the whole device 100 (e.g., die) for avoiding any die tilt when connecting the die to (e.g., mounting the die upon) the printed circuit board 600.

Example Fabrication Processes

Figure 8A:
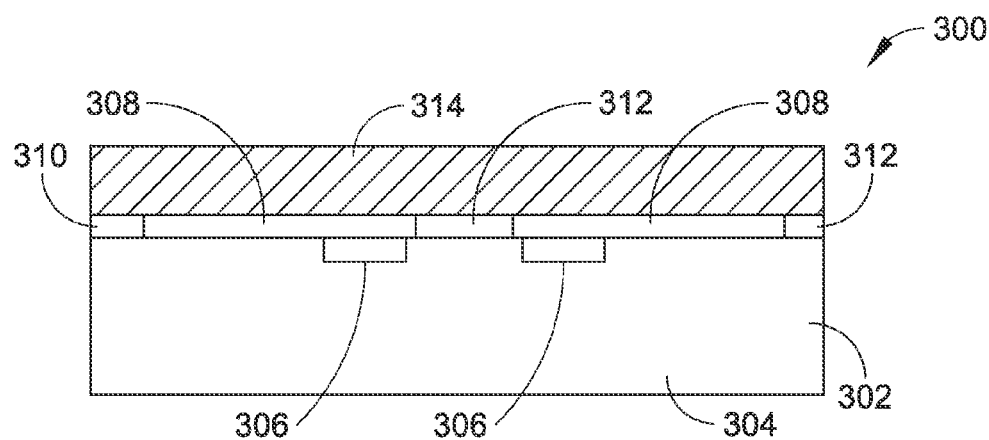
FIGS. 8A through 8J are diagrammatic partial cross-sectional views illustrating the fabrication of a wafer-level package device, such as shown in FIGS. 1, 4 and 7, in accordance with the process shown in FIGS. 9A and 9B.
Figure 9A:
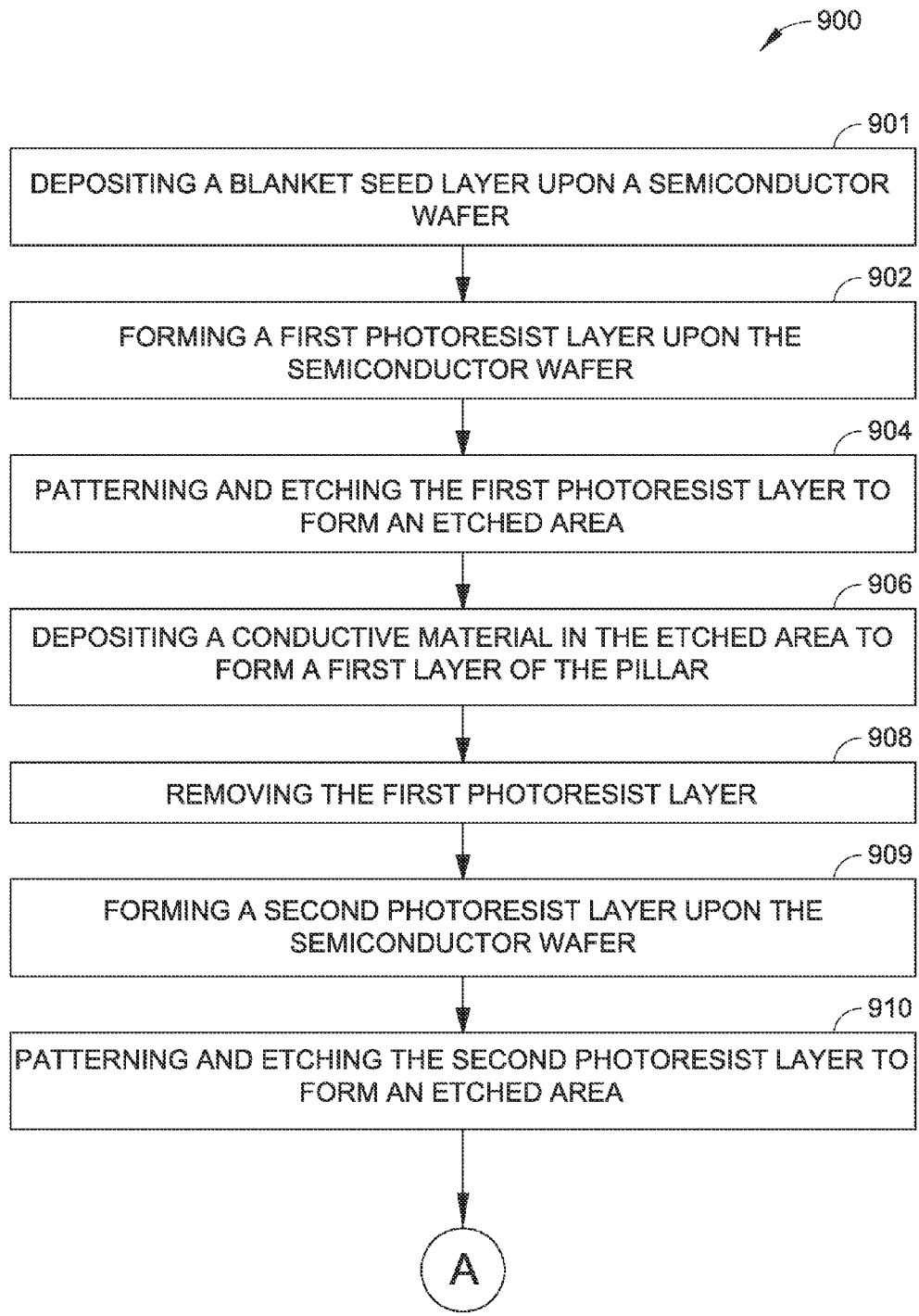
FIGS. 9A and 9B depict a flow diagram illustrating a process in an example implementation for fabricating wafer-level package devices, such as the wafer-level package devices shown in FIGS. 1 through 5 and FIG. 7.
Figure 9B:
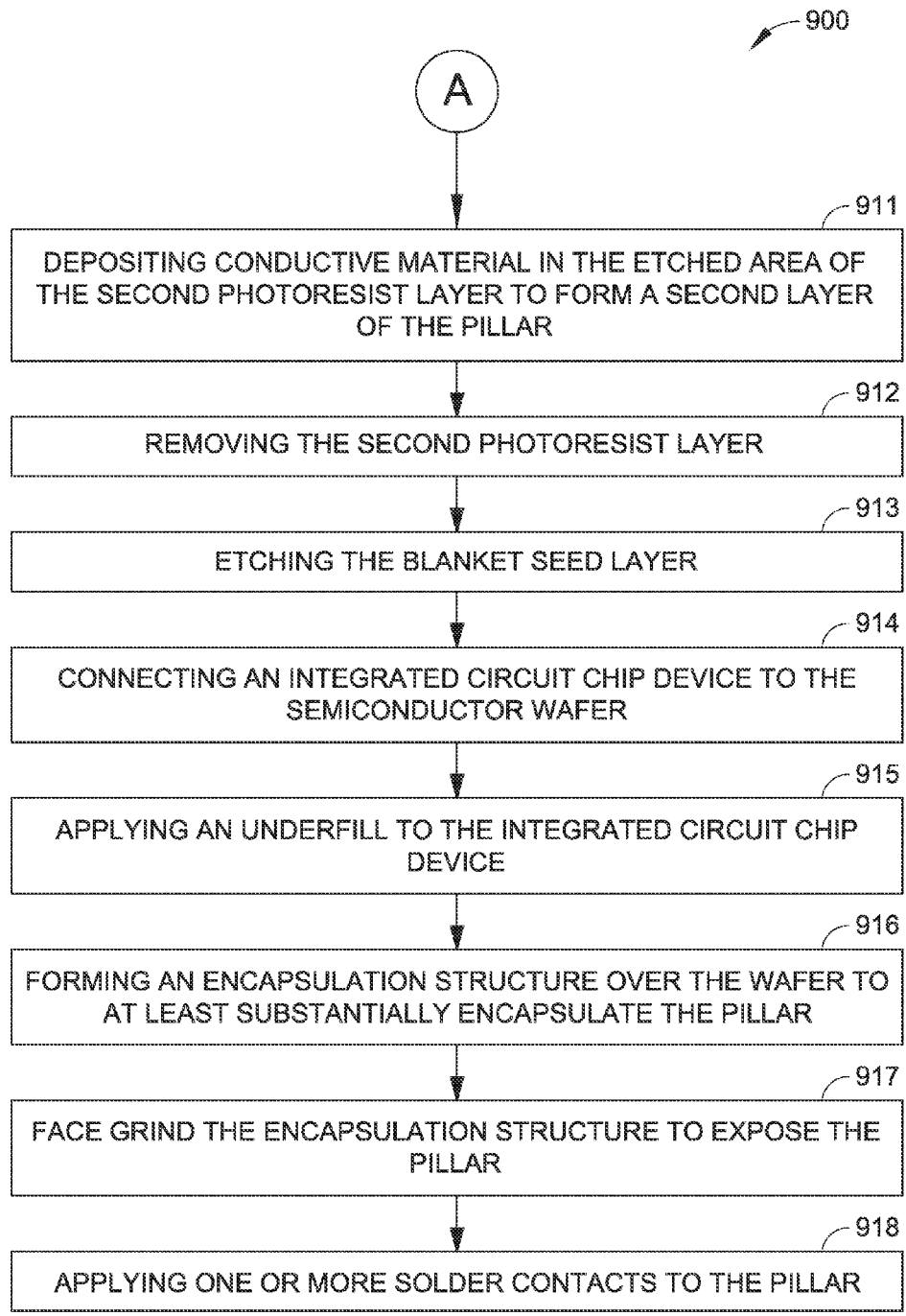

FIGS. 9A and 9B illustrate an example process 900 that employs wafer-level packaging techniques to fabricate semiconductor devices having pillars, such as the devices 100 shown in FIGS. 1 through 5 and FIG. 7. In the process 900 illustrated, one or more pillars are initially formed over a semiconductor wafer. As described herein, a lamination/deposition process may be employed to form the pillars. Accordingly, a blanket seed layer is deposited on the semiconductor wafer 300 (Block 901). For example, the blanket seed layer may be doped silicon or the like. In embodiments, a first photoresist layer is formed over (e.g., formed upon) a semiconductor wafer (e.g., the seed layer of the semiconductor wafer (Block 902) prior to segmentation of the wafer into individual circuit chips (die). FIG. 8A illustrates a portion of the wafer 300, which, when processed through suitable FEOL fabrication techniques, includes a semiconductor substrate 302 that comprises an integrated circuit chip 304. The integrated circuit chip 304 includes one or more integrated circuits 306 formed therein. The substrate 302 may include a redistribution structure, such as a redistribution layer (RDL) 308, formed over the surface 310 of the substrate 302. As shown, a dielectric layer 312 may also be formed over the surface 310 of the substrate 302. The dielectric layer 312 may be benzocyclobutene polymer (BCB), silicon dioxide ($SiO_2$), or the like. The lamination step includes applying a first photoresist layer 314 over the wafer 300 (e.g., over the RDL 308 and the dielectric layer 312). The first photoresist layer 314 may be a composition of photopolymer and polyester film that may be patterned and etched through one or more suitable dry film lamination processes.

Figure 8B:
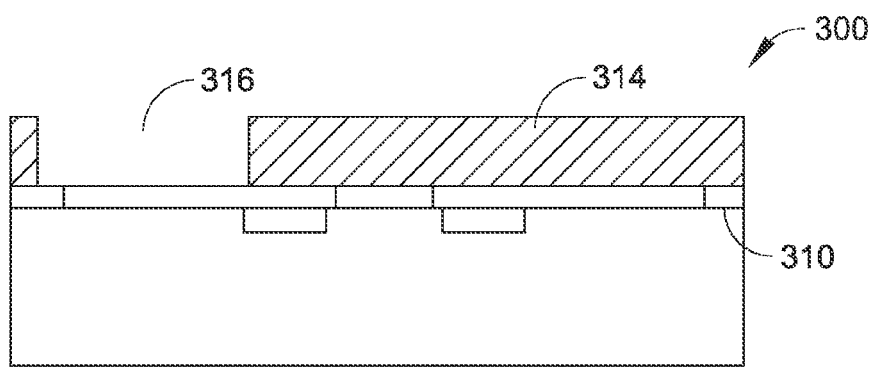

The first photoresist layer 314 is then patterned and etched to form an etched area (Block 904). FIG. 8B illustrates the first photoresist layer 314 which is shown patterned and etched to form etched area 316. The etched area 316 extends at least through the photoresist layer 314 to pads of the RDL layer 308.

Figure 8C:
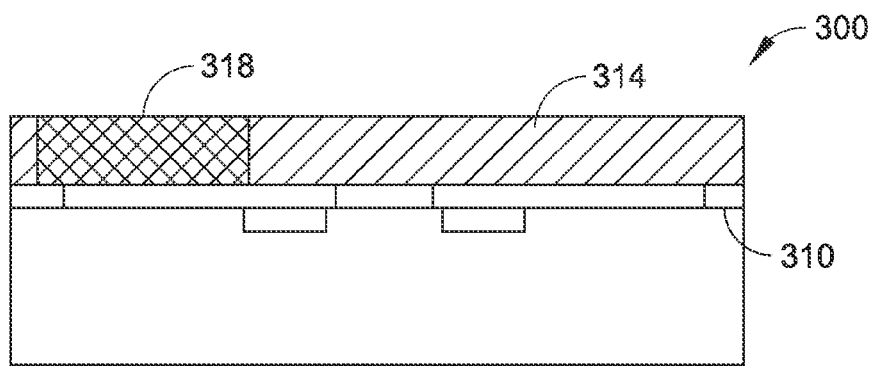

A conductive material is then deposited in the etched area to form the pillar(s) (Block 906). FIG. 8C illustrates the conductive material 318 deposited in the etched area 316 to form a first layer (P1) of the pillar 324. In one or more implementations, a suitable electroplating process may be utilized to deposit a conductive material 318 in the etched area 316 of the first photoresist layer 314. The conductive material 318 may comprise copper, aluminum, or a like conducting metal, or other conducting material.

Figure 8D:
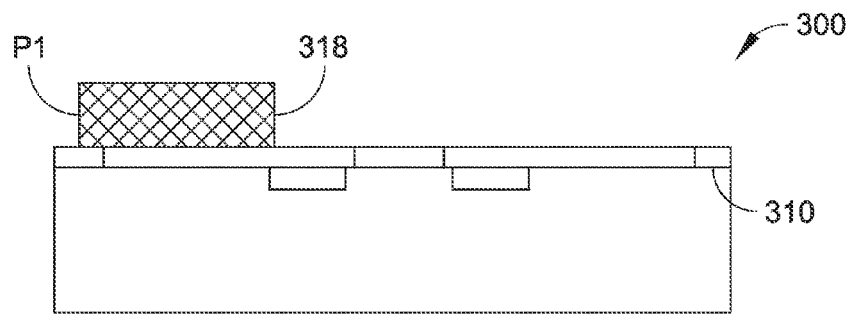
Figure 8E:
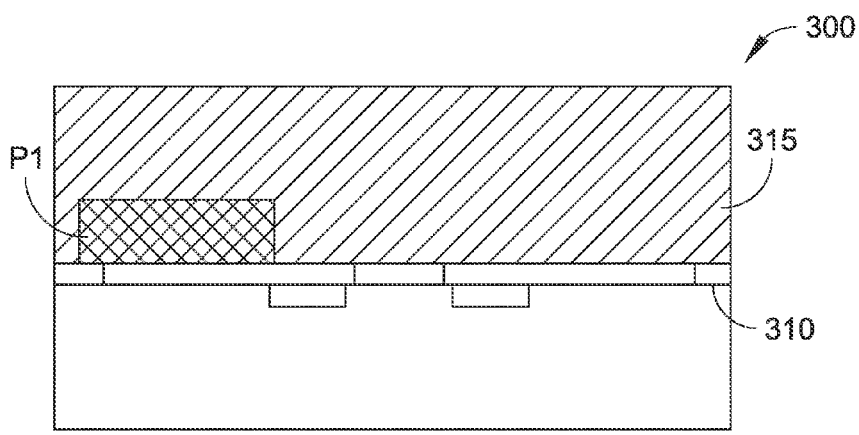
Figure 8F:
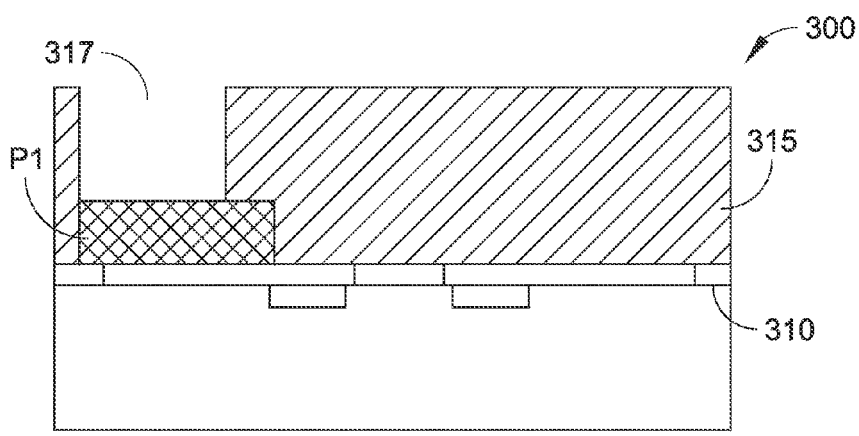
Figure 8G:
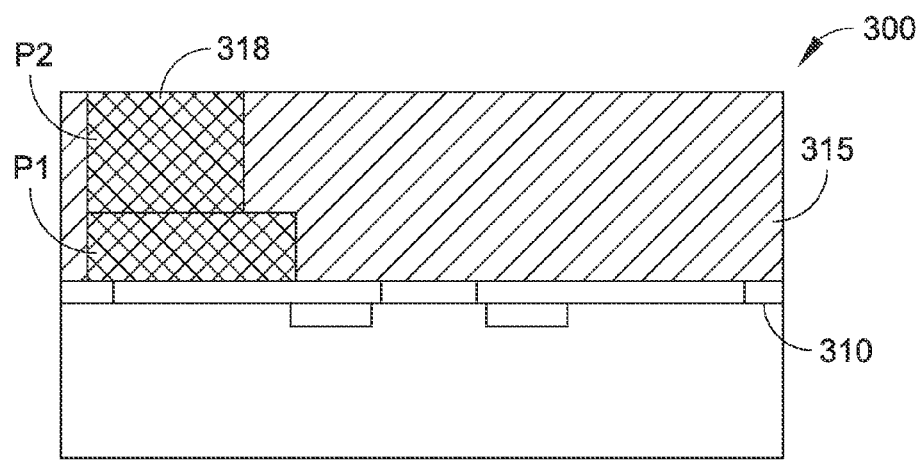
Figure 8H:
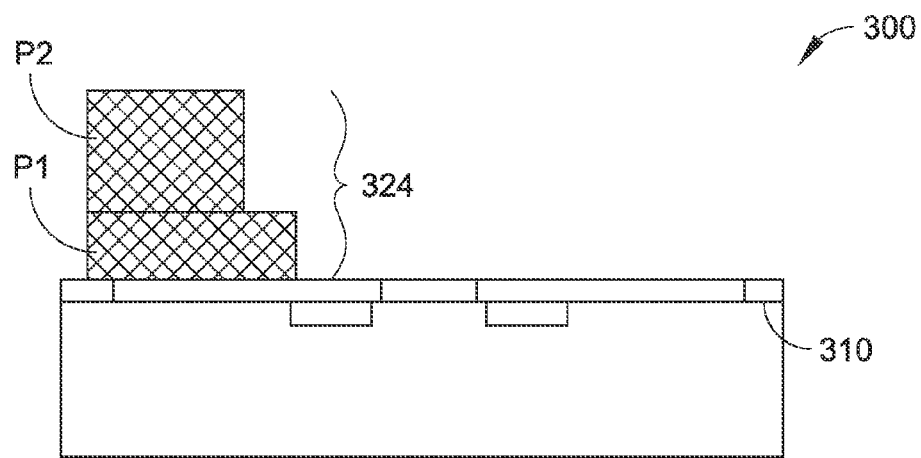

Once the pillar (e.g., the first layer (P1) of the pillar 324) has been formed, the photoresist layer is removed (Block 908). FIG. 8D illustrates removal of the photoresist layer 314 through suitable stripping processes. In embodiments, a second photoresist layer is formed over the semiconductor wafer (e.g., and over the first layer (P1) of the pillar 324) (Block 909). FIG. 8E shows the second photoresist layer 315 placed over the wafer 300. In embodiments, the second photoresist layer 315 is then patterned and etched to form an etched area (Block 910). FIG. 8F illustrates the second photoresist layer 315 which is shown patterned and etched to form etched area 317. In embodiments, the etched area 317 extends to the first layer (P1) of the pillar 324. Conductive material 318 is then deposited in the etched area 317 to form the pillar(s) (e.g., the second layer (P2) of the pillar 324) (Block 911). FIG. 8G illustrates the conductive material 318 deposited in the etched area 317 to form the second (e.g., upper) layer (P2) on top of the first layer (P1) of the pillar 324. In one or more implementations, a suitable electroplating process may be utilized to deposit conductive material (e.g., copper) 318 in the etched area 317 of the second photoresist layer 315. In embodiments, once the pillar (e.g., the second layer (P2) of the pillar 324) has been formed, the second photoresist layer 315 is removed (Block 912). FIG. 8H illustrates removal of the second photoresist layer 315 through suitable stripping processes. In embodiments, the blanket seed layer is etched (Block 913). In addition, the pillar(s) 324 may be subjected to a suitable seed etch process. As described above, in embodiments, an integrated circuit chip device 114 (as shown in FIGS. 2 and 4) may be positioned over and connected to the substrate 302 (Block 914). For example, the integrated circuit chip device 114 may be connected to substrate 302 via a flip-chip process. An integrated circuit chip device 114 may extend system-in-a-package capabilities to the integrated circuit chip 304.

Figure 8I:
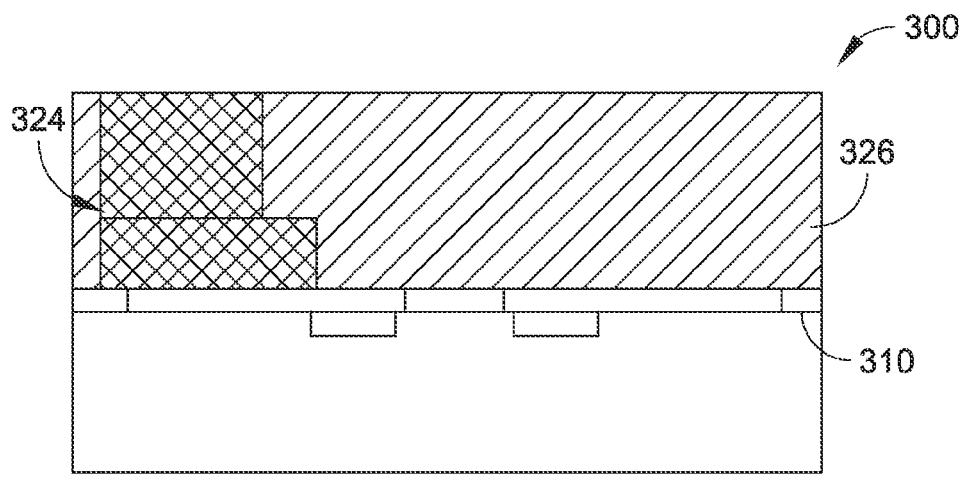
Figure 8J:
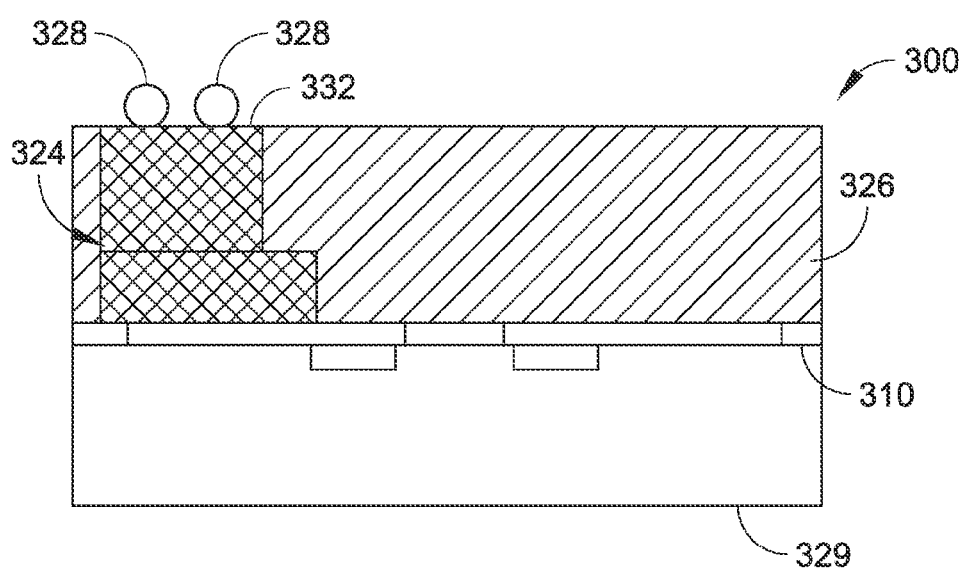

Once the pillar(s) 324 are formed, an encapsulation structure (e.g., dielectric compound) is formed over the wafer to at least substantially encapsulate the pillars. (Block 916). FIG. 8I illustrates the encapsulation structure 326 formed over the surface 310 of the wafer 300 to provide support and insulation to the integrated circuits 306 and the pillar(s) 324. In embodiments, multiple polymer layers (e.g., epoxy, etc.) may be deposited over the surface 310 to form the encapsulation structure 326. In embodiments, a top surface of the encapsulation structure 326 may be formed at or extend beyond a top surface of an exposed end 332 of the pillar 324. It is contemplated that an epoxy material may also be deposited on the backside (e.g., over the surface 329) of the wafer 300. In embodiments where the top surface of the encapsulation structure 326 extends past/above the exposed end 332 of the pillar 324, the encapsulation structure 326 may be subjected to a grinding process to expose pillars 324 (e.g., expose the end 332 of the pillar 324 distal from the substrate 302) (Block 917). For example, the encapsulation structure 326 and the exposed end 332 of the pillar 324 (e.g., a top surface of layer (P2) of the pillar 324) may be subjected to a face grinding process for surface planarization. As shown, the encapsulation structure 326 extends at least substantially the length (e.g., depth) of the pillars 324. In embodiments, prior to application of the encapsulation structure (Block 916), as part of the flip-chip process step (Block 914), an underfill (e.g., a capillary underfill) can be applied to integrated circuit chip device 114 for promoting reliability, especially for temperature cycling (Block 915). In alternative embodiments, rather than applying an underfill to the integrated circuit chip device 114, the encapsulation structure (e.g., overmold) 326 may be chosen to provide a reliable package solution (e.g., mechanical and environmental protection) without creating processing issues, especially with excessive wafer warpage.

One or more solder contacts are then applied to the pillar. (Block 918). For example, solder contacts 328 may be formed upon (e.g., applied to) the exposed end 332 of the pillar 324 (e.g., the end of the pillar 324 distal to the wafer 300). In embodiments, formation of the solder contacts 328 upon the pillars 324 may be done using solder ball drop, solder plating, or solder printing. Once the step of forming the solder contacts 328 upon the pillars 324 is complete, suitable processes may be employed to segment the individual integrated circuit chips 304 into individual packages.

In other embodiments, the step of applying the solder contacts to the pillar (Block 918) can be performed before the step of applying the encapsulation structure (Block 916). In such embodiments, the step of connecting the integrated circuit chip device to the substrate (Block 914) can be performed either before or after the solder contacts are applied to the pillar(s) (Block 918), but prior to application of the encapsulation structure (Block 916).

A packaging structure containing multiple die, which is configured for carrying high current is described herein. Further, a low cost, high-reliability method for chip-to-wafer (e.g., wafer level) packaging of two or more die (e.g., a method for fabricating the packaging structure containing multiple die) to provide a structure configured for use in high current applications is described herein. The device 100 described herein promotes improved reliability performance (e.g., board-level reliability) due to higher solder standoff and/or higher printed circuit board standoff. Further, the device 100 described herein, by using a smaller amount of copper than some currently implemented devices, may promote improved reliability performance, reduced warpage typically caused by thermal mismatch between thick copper and the silicon die and reduction in required copper plating tool capacity to support a given wafer volume. Further, the device 100 described herein promotes improved manufacturability (e.g., with reduced plating time and reduced wafer warpage) and lower capital expense. Further, the method described herein allows a designer to: a.) design a power-field-effect transistor (power FET) in a fabrication (FAB) technology optimized for power; and b.) to design a separate, smaller controller die. The two die may then be combined into a low cost wafer-level package capable of carrying the high currents of the power-FET.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:
1. A process comprising:
  forming a pillar upon a semiconductor wafer, the pillar extending from the semiconductor wafer to a first height above the semiconductor wafer;
  connecting an integrated circuit chip device to the semiconductor wafer, the integrated circuit chip device extending from the semiconductor wafer to a second height above the semiconductor wafer;
  forming an encapsulation structure over the semiconductor wafer, the encapsulation structure at least substantially encapsulating the pillar; and
  applying at least one solder contact to the pillar, the at least one solder contact being located at a third height above the semiconductor wafer,
  wherein the second height is less than at least one of: the first height and the third height;
  wherein the step of forming the pillar upon the semiconductor wafer comprises:
  depositing a blanket seed layer on the semiconductor wafer;
  applying a first photoresist layer over the semiconductor wafer;
  patterning and etching the first photoresist layer to form an etched area;
  depositing a conductive material in the etched area to form a first layer of the pillar;
  at least substantially removing the first photoresist layer;
  applying a second photoresist layer over the semiconductor wafer;
  patterning and etching the second photoresist layer to form an etched area of the second photoresist layer;
  depositing conductive material in the etched area of the second photoresist layer to form a second layer of the pillar;
  at least substantially removing the second photoresist layer; and
  etching the blanket seed layer.

2. The process as claimed in claim 1, wherein forming the encapsulation structure further comprises depositing an epoxy material over the semiconductor wafer, the encapsulation structure at least partially encapsulating the pillar and the integrated circuit chip device.

3. The process as claimed in claim 1, wherein the step of connecting the integrated circuit chip device to the semiconductor wafer further comprises:
   applying an underfill to the integrated circuit chip device.

4. The process as claimed in claim 1, further comprising:
   prior to applying the at least one solder contact to the pillar, grinding the encapsulation structure to expose the pillar.

* * * * *